United States Patent [19]

Gland et al.

[11] Patent Number: 5,296,255
[45] Date of Patent: Mar. 22, 1994

[54] IN-SITU MONITORING, AND GROWTH OF THIN FILMS BY MEANS OF SELECTED AREA CVD

[75] Inventors: John L. Gland, Pinckney; Johannes W. Schwank; Kensall D. Wise, both of Ann Arbor, all of Mich.

[73] Assignee: The Regents of the University of Michigan, Ann Arbor, Mich.

[21] Appl. No.: 835,340

[22] Filed: Feb. 14, 1992

[51] Int. Cl.⁵ .............................................. C23C 16/00
[52] U.S. Cl. ..................................... 427/8; 427/248.1; 427/252; 427/255
[58] Field of Search ................ 427/8, 248.1, 255, 252, 427/10

[56] References Cited

U.S. PATENT DOCUMENTS

| | | | |
|---|---|---|---|
| 4,348,886 | 9/1982 | Faith, Jr. ................................. | 427/8 |
| 4,652,463 | 3/1987 | Peters ................................. | 427/225.3 |
| 4,923,717 | 5/1990 | Gladfeter et al. ..................... | 427/253 |
| 4,953,387 | 9/1990 | Johnson et al. ....................... | 422/98 |

OTHER PUBLICATIONS

*IEEE Electron Device Letters*, vol. 14, No. 3, Mar. 1993, 3 pages.

*Primary Examiner*—Shrive Beck
*Assistant Examiner*—David M. Maidrana
*Attorney, Agent, or Firm*—Oblon, SPivak, McClelland, Maier & Neustadt

[57] ABSTRACT

A method for selectively forming thin films by CVD in which at least two substrates are exposed to a decomposable gas, and one of the subsrates is independently heated to selectively form a film on the heated substrate. The invention further comprises a step of measuring an electrical property of the film during deposition.

18 Claims, 3 Drawing Sheets

IN-SITU MONITORING, AND GROWTH OF THIN FILMS BY MEANS OF SELECTED AREA CVD

BACKGROUND OF THE INVENTION

1. Field of the Invention

The invention relates to a method of forming thin films.

2. Discussion of the Background

Chemical Vapor Deposition (hereinafter CVD) is a process by which a solid film is deposited on a substrate by a chemical reaction of gaseous reactants on or near the surface. CVD is a preferred method for depositing thin films due to its ability to deposit uniformly on relatively complex shapes, and its applicability to a wide range of materials. The types of CVD processes can be categorized according to the nature of the chemical reaction, the type of reaction activation energy, system pressure and temperature and type of reagents. The chemical reactions which may be employed for CVD include decomposition (pyrolysis), reduction, oxidation, hydrolysis, disproportionation, nitride formation, carbide formation, synthesis, and combined reactions. In these processes, the substrate may undergo chemical changes. It can act as a reducing agent, dissolve the deposition component, react exothermally with the deposition compound, or exert a catalytic effect. Selection of a reaction is dependent upon desired thin film composition. The energy required to initiate the reactions listed above can come in different forms. Reactions may be thermally activated, plasma-promoted, photon induced, laser induced, or electron induced.

Besides CVD, sputtering is also widely used for the formation of thin films for chemical microsensors. According to the sputtering process, material is removed from a target, carried by plasma and deposited onto a substrate. This method is considered inefficient since as much as 90% of the energies supplied is transferred into heat.

According to the CVD process, a compound is reduced or dissociated resulting in an adherent coating onto a substrate.

Both these methods suffer drawbacks in that it is difficult to restrict the film deposition to a well-defined, small area of a substrate. The very nature of these deposition methods has required the use of complex masks and etching techniques to restrict the film deposition to a well- o defined small area of a substrate.

In addition to the problems of controlling the area of deposition, neither of these methods allow for the monitoring of the film as it is being deposited. Typically the film formation is controlled by the amount of time that deposition occurs forming a film of a desired thickness. However, no methods presently exist for monitoring the formation of a thin film while it is being formed. Therefore, there is currently no method for selectively depositing a thin film by CVD while directly monitoring the progress of film deposition.

SUMMARY OF THE INVENTION

Accordingly, one object of the present invention is to provide a novel process for in situ monitoring and growth of thin films.

It is another object of this invention to provide a method for depositing a thin film onto selected areas by chemical vapor deposition.

These and other objects are achieved according to the present invention which provides a new process for selectively depositing a thin film while monitoring the deposition of the film onto a substrate.

The object of the present invention is provided for by depositing a thin film onto at least one "window" which is independently heated over a large temperature range of from room temperature up to 1200° C. within milliseconds. The "window" allows for very rapid upward or downward adjustment of the temperature over hundreds of degrees within a few milliseconds. Deposition of thin films can be triggered locally, by decomposing suitable gases only in the immediate vicinity of a hot window. In addition, these windows are equipped with electrodes for monitoring in situ the progress and end point of film deposition. The electrodes are able to monitor the electrical characteristics of the thin film as it is being deposited.

BRIEF DESCRIPTION OF THE FIGURES

A more complete appreciation of the invention and many of the attended advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
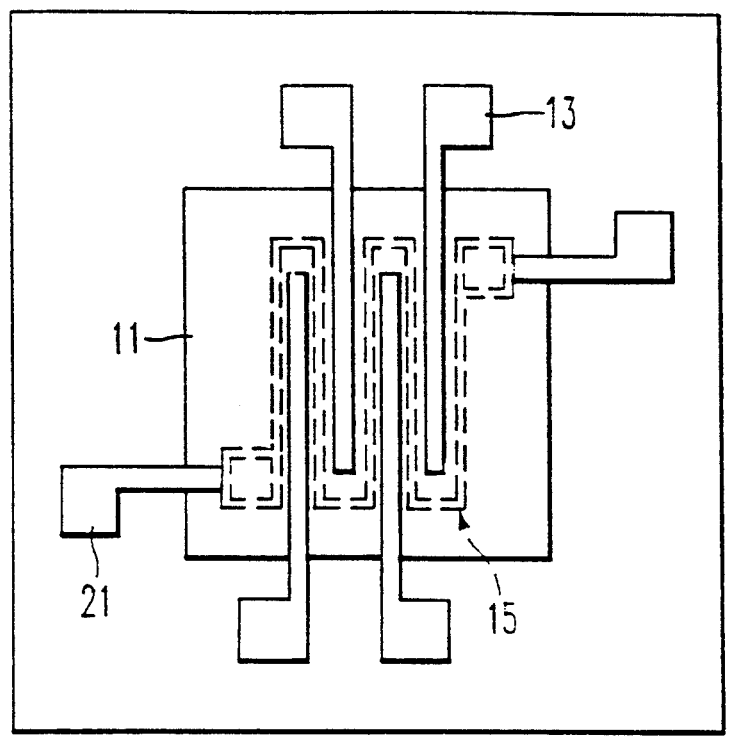
FIG. 1 provides a top view of the dielectric window used to practice the present invention.

The process of the present invention is low pressure chemical vapor deposition (LPCVD). The LPCVD process is characterized by deposition on a heated substrate in a reactor under reduced pressure (0.01–100 torr). Pyrolysis is a common reaction for LPCVD processes, although any of the reactions described above can be used. Use of pressures of less than 1 atm improves layer quality and film homogeneity. Other advantages of this method are suppression of autodoping from the substrate and control of the deposition rate by surface reaction only.

The first step in the sequence of events which occur in the CVD process is thermal decomposition of the substance to be deposited or the reaction of that compound with other vapor phase reactants and/or the substrate. The second step is deposition of a nonvolatile product on the substrate. In some cases volatile by-products will be formed and transported into the gas phase. One of the drawbacks of conventional CVD methods is that it is difficult to restrict the film deposition to well-defined, small areas of a substrate, and that it is not possible to directly monitor in situ the progress of film deposition.

The present invention overcomes two major limitations of the state-of-the-art in conventional CVD technology: First, the process allows the deposition of uniform films in geometrically well defined, small areas of a generic device structure containing one or more "windows". Each window, can be independently heated over a large temperature range, from room temperature up to as high as 1200° C. within less than 100 milliseconds. The thermal mass of each window is negligible compared to the rest of the device, while the rim surrounding each window provides a heat sink with large heat capacity. The deposition of thin films can be triggered locally, by decomposing suitable gases only on the hot window surface, resulting in selected area CVD (SACVD). Due to the small amount of power supplied to the window selected for film deposition, the bulk gas phase in the CVD reactor will remain essentially at room temperature where decomposition of the gas is hindered.

Second, the windows have electrodes for monitoring in situ the progress and end-point of the film deposition process. The present windows are equipped with from two to four electrodes. Additional electrodes are also possible. A four-point-probe electrode configuration is capable of monitoring window impedance, which changes as a function of thin-film deposition. Once a desired characteristic is obtained, the film deposition process can be abruptly stopped by switching the heater current to the window off and ballistically cooling the window to a temperature where SACVD processes cannot continue.

The process of the present invention is practiced by exposing the array of "windows" to a gas and independently heating one or more windows to affect CVD. The formation of the film can be monitored simultaneously through the electrode sensors located on the surface of the polysilicon window. Thus as the film is being deposited, the properties of the film can be monitored and film deposition may be interrupted at any time desired.

A suitable dielectric window for practicing the present process is described in U.S. Pat. No. 4,953,387. The dielectric window consists of a thin dielectric window supported by an outer rim of thicker silicon. The window is composed of successive layers of silicon dioxide, silicon nitride, and silicon dioxide which are stress compensated so as to be in mild tension. In a preferred embodiment the window forms a 1.3 mm-square by 1.3 $\mu$m - thick window. The window is successfully micromachined from a wafer bulk.

Figure 3:
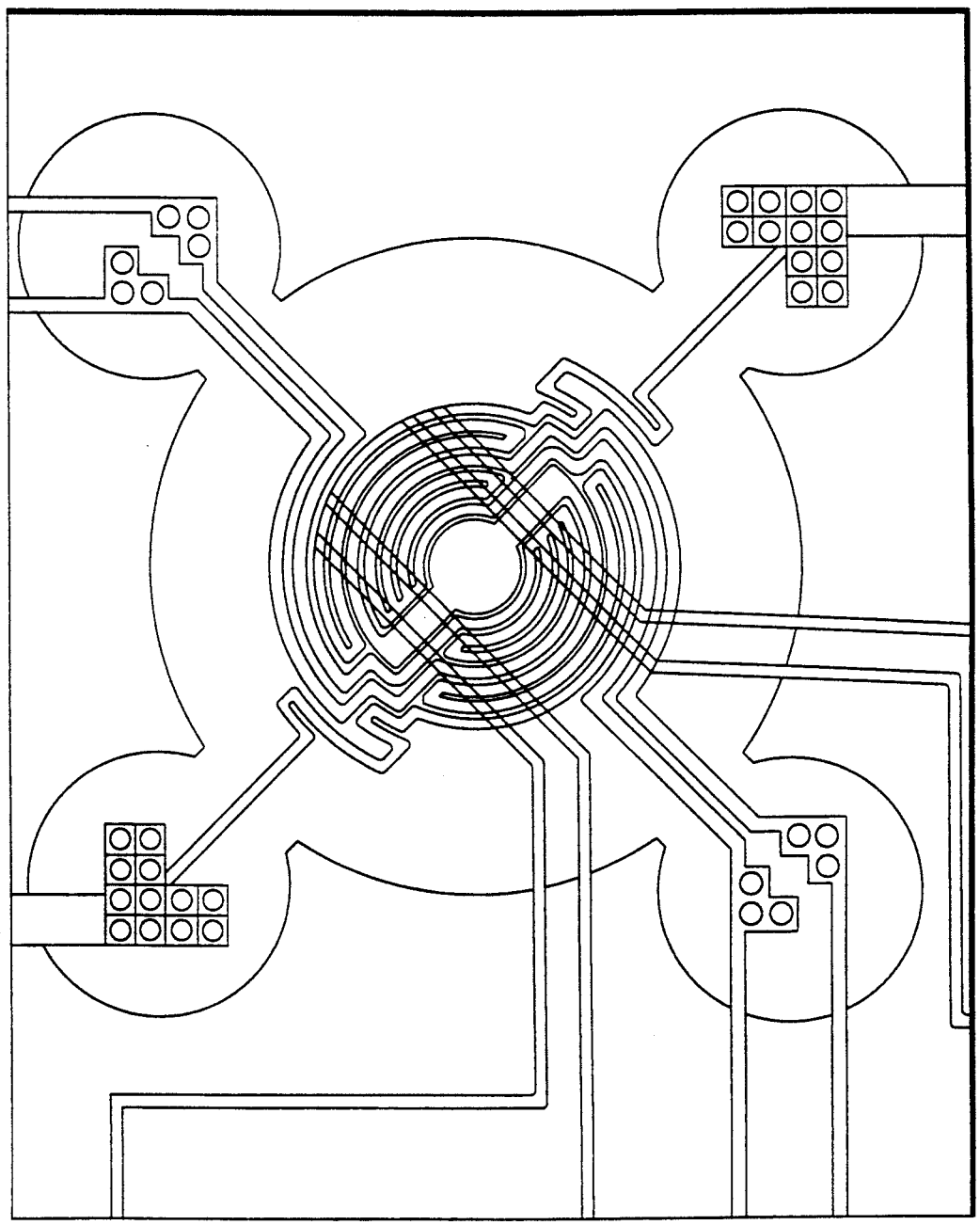
FIG. 3 provides a top view of an alternative orientation of the heating element.

A meandering boron diffused silicon heater is located under the window which allows for heating temperatures above 1200° C. in a few milliseconds. The heater is not limited to any particular configuration, however, an intertwining circular pattern as shown in FIG. 3 is preferred. The dielectric window provides a high degree of thermal isolation from the chip rim (14), ensuring high heating efficiency and low-power operation. The structure also allows for the surface of the window to be planar on its upper surface. The rim surrounding each window provides a heat sink with large heat capacity. Additional structures can be integrated onto such windows including thermocouples for independent temperature measurements, contact resistant measurement structures and different film geometries to evaluate effects of surface area on sensitivity. A rim of thick silicon provides structural stability to the device.

In a preferred embodiment the heater is located within the larger circular window in the center device. The heater is formed in an intertwining circular pattern with heater contacts (21) provided in the four corners of the device. As shown in FIG. 3, the heater contacts are located at four smaller circles around the larger circular window in the center of the device.

The window is fabricated beginning with a 1175° C. solid-source boron diffusion into a patterned wafer to define the rim area of the silicon chip from the front and the pattern for defining the final window and chip size from the back. A thermal oxide is now grown, followed by polysilicon deposition, doping and patterning for the thermocouples and any other device structures. Films of low pressure chemical vapor deposition $Si_3N_4$ and $SiO_2$ complete the dielectric window stack. A buffered HF etch and an rf plasma etch are used to open contacts through the $SiO_2$ and $Si_3N_4$ to the buried heater and the thermocouple.

Figure 2:
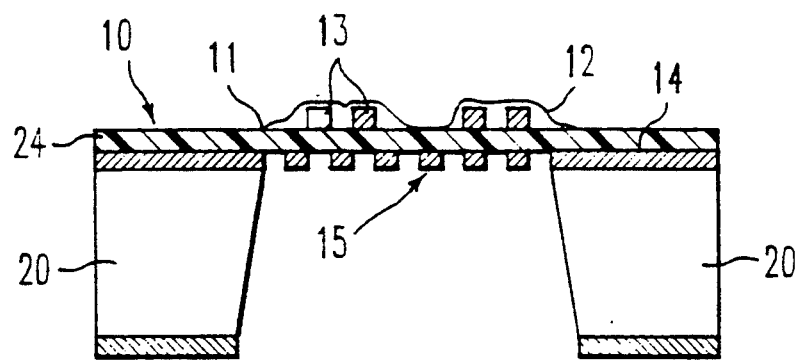
FIG. 2 provides a cross sectional view of the dielectric window used to practice the present invention.

Now referring to the figures, wherein like reference numerals designate identical or corresponding parts throughout the several views and more particularly to FIGS. 1 and 2, the window features a thin-diaphragm dielectric window (11) in the center of the chip. A heater means (15) below this window allows for rapid temperature cycling of the device, in particular of the dielectric window. The substrate (24) may be advantageously designed with support means (20). Each window is equipped with electrodes (13) to monitor the electrical characteristics of the deposited film.

The substrate (24) and the dielectric window (11) of the present device comprises a $SiO_2/Si_3N_4/SiO_2$ dielectric sandwich in mild tension. The thickness of these measured as the ratio of the total thickness of silicon oxide layers to the thickness of the silicon nitride layer is greater than 1:1, preferably greater than 2.5:1, and up to 6:1.

As suitable gases for SACVD, any gas which is suitable for CVD is appropriate. In particular, $AuCl_3$, auric phosphine complexes, auric dimethylacetylacetonate, auric alkylmercaptides, $Pt(PF_3)_4$, bis(allyl)platinum, $CpPtMe_3$ (cyclopentadienyl-trimethyl-platinum), $TiCl_4$, $Ti(OiPr)_4$ (Titanium-tetraisopropoxide), and $TiCl_4$—$CH_4$—$H_2$, and $TiCl_4$—$C_3H_8$—$H_2$ may be used.

The present process may be used to deposit films of metals, metal oxides, polymers, ceramics or any other material which may be deposited by CVD.

The present invention allows for the deposition of CVD films in geometrically well defined, small areas of generic device structures containing one or more windows. The basic device has two windows and can be abutted in a hybrid set of four chips to obtain an 8-element window array in a single package. The impedance shifts which occur when a film is deposited are used as indicators of film growth and film characteristics. Each window interfaces with a host node via an 8-line front end standard interface. As a result of employing this standard, each chip requires only 10 shared pads (including 3 for power and ground). Each window operates independently of each other and all can be monitored simultaneously. The circuitry designed for this device allows the temperature of each window to be set from ambient to 1200° C. with 8 bits of resolution. In order to accommodate a broad range of thin films, the on-chip inductance detector can operate on films from 3 $\mu$ to as high as 300 K$\mu$. Moreover, to allow the alternating current characterization of the deposited thin films, an on-chip pulse generator has been incorporated which offers 8 bits of resolution over a frequency range of from direct current to 5 MHz.

Figure 4:
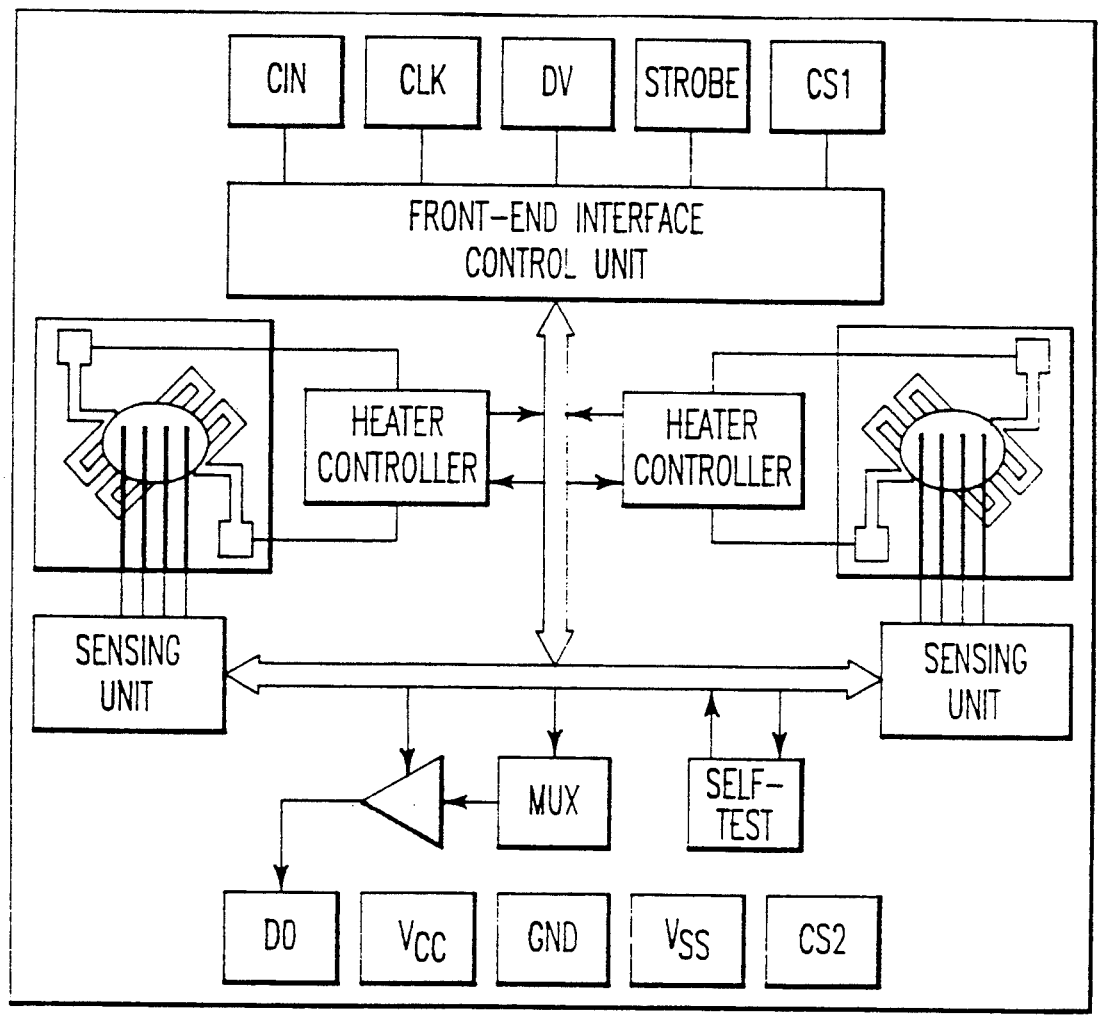
FIG. 4 provides a block diagram of a device containing multiple dielectric windows.

A block diagram of the active chip is shown in FIG. 4. The on-chip readout electronics can be divided into three major units: interface/control, heater control and sensing module. The interface/control unit is responsible for communicating with the sensor node (via the front-end standard), and for receiving, interpreting, and executing commands sent by the node. It also generates proper control signals for the other units. The heater control maintains a stable window temperature which can be programmed by the user via the front-end-standard interface. It also provides a voltage output corresponding to the window temperature which can be used to characterize the chip. Providing a stable temperature is challenging since the energy required for the heater is a function of the gas pressure and its associated thermal conductivity.

In addition, by changing the gas a different film can be deposited on an adjacent window by the same procedure. In such a fashion a multiple array of different chemical films can be deposited by CVD onto a substrate in fine geometric patterns without the need to mask portions of the substrate.

Prior to film deposition, the window areas of the generic chips are cleaned using gas phase thermally enhanced etching procedures to ensure adhesion of the deposited thin film. This cleaning procedure is based on current cleaning methods and optimized for these thin windows. Good electrical contact of the deposited film with inert contacts, such as those formed from iridium, allows for the electrical properties of the film to be used to monitor the film as it is grown. After growth, the thin films can be annealed and equilibrated, again while monitoring in situ the change in film impedance.

A variation of the SACVD process consists of first depositing a film on the heated window, and then using this thin film to catalyze subsequent deposition processes of a second film on top of the first one. Alternatively, the original SACVD film can be chemically modified by controlled surface reactions, such as treatment in a reducing or oxidizing gas environment. For example, metal films can be converted to corresponding oxides, nitrides, or carbides films or solutions thereof, again with in situ monitoring of the changes in film characteristics.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for selectively forming thin films comprising:
   i) exposing at least two substrates to a decomposable gas;
   ii) independently heating one of said substrate, causing decomposition of said gas to selectively form a film on said heated substrate;
   iii) measuring an electrical property of said film while said film is being deposited;
   iv) independently heating one of said substrate, different from said substrate of step ii), causing decomposition of said gas to form a film on said heated substrate; and
   v) measuring an electrical property of said film while said film is being deposited.

2. A method for selectively forming thin films comprising:
   i) exposing at least one substrate to a decomposable gas;
   ii) independently heating said at least one substrate, causing decomposition of said gas to selectively form a film on said heated substrate;
   iii) measuring an electrical property of said film while said film is being deposited.

3. The method of claim 2, wherein said at least one substrate comprises:
   i) a substrate having two opposed major surfaces and including a dielectric window region;
   ii) heater means situated on said dielectric window region on one of said opposed faces; and
   iii) a conductivity cell electrode means situated on said dielectric window region on the other of said opposed surfaces;
   wherein:
   said heater means heats said dielectric window regions; and
   said conductivity cell electrode means senses the conductivity and capacitance of said film as it is being deposited.

4. The method of claim 3, wherein said heater means is a polysilicon heater means.

5. The method of claim 3, wherein said heater means is a boron-doped silicon heater means.

6. The method of claim 3, wherein said substrate is a laminate comprising a silicon nitride layer sandwiched between two silicon oxide layers.

7. The method of claim 6, wherein said substrate has a thickness in which the total silicon oxide to silicon nitride ratio is at least 1:1.

8. The method of claim 7, wherein said ratio is from 2.5:1 to 6:1.

9. The method of claim 2, wherein said decomposable gas is selected from the group consisting of $AuCl_3$, auric phosphine complexes, auric dimethylacetyl acetonate, auric alkyl mercaptides, $Pt(PF_3)_4$, bis (allyl)platinum, cyclopentadienyl-treimethyl-platinum, titanium tetraisopropoxide, $TiCl_4$—$CH_4$—$H_2$, $TiCl_4$—$C_3H_8$—$H_2$.

10. The method of claim 3, wherein said substrate has two opposed major surfaces and includes a dielectric window region composed of a laminate of layers of silicon oxide and silicon nitride which make up a thermally compensated window.

11. The method of claim 1, wherein each of said substrates comprises:
   i) a substrate having two opposed major surfaces and including a dielectric window region;
   ii) heater means situated on said dielectric window region on one of said opposed faces; and
   iii) a conductivity cell electrode means situated on said dielectric window region on the other of said opposed surfaces;
   wherein:
   said heater means heats said dielectric window region; and
   said conductivity cell electrode means senses the conductivity and capacitance of said film as it is being deposited.

12. The method of claim 2, wherein said heater means is a polysilicon heater means.

13. The method of claim 2, wherein said heater means is a boron-doped silicon heater means.

14. The method of claim 2, wherein said substrate is a laminate comprising a silicon nitride layer sandwiched between two silicon oxide layers.

15. The method of claim 5, wherein said substrate has a thickness in which the total silicon oxide to silicon nitride ratio is at least 1:1.

16. The method of claim 6, wherein said ratio is from 2.5:1 to 6:1.

17. The method of claim 1, wherein said decomposable gas is selected from the group consisting of $AuCl_3$, auric phosphine complexes, auric dimethylacetylacetonate, auric alkylmercaptides, $Pt(PF_3)_4$, bis(allyl)-platinum, (cyclopentadienyl-trimethyl-platinum), $TiCl_4$, titanium tetraisopropoxide, $TiCl_4$—$CH_4$—$H_2$, $TiCl_4$—$C_3H_8$—$H_2$.

18. The method of claim 2, wherein said substrate has two opposed major surfaces and includes a dielectric window region composed of a laminate of layers of silicon oxide and silicon nitride which makes up a thermally compensated window.

* * * * *